United States Patent
Blankenship et al.

(10) Patent No.: US 7,165,205 B2
(45) Date of Patent: Jan. 16, 2007

(54) METHOD AND APPARATUS FOR ENCODING AND DECODING DATA

(75) Inventors: Yufei Blankenship, Streamwood, IL (US); Brian K. Classon, Palatine, IL (US)

(73) Assignee: Motorola, Inc., Schaumburg, IL (US)

( * ) Notice: Subject to any disclaimer, the term of this patent is extended or adjusted under 35 U.S.C. 154(b) by 305 days.

(21) Appl. No.: 10/874,611

(22) Filed: Jun. 23, 2004

(65) Prior Publication Data

US 2005/0257119 A1    Nov. 17, 2005

(51) Int. Cl.
*H03M 13/11*    (2006.01)
(52) U.S. Cl. .................... 714/752; 714/774
(58) Field of Classification Search ............ 714/752, 714/774
See application file for complete search history.

(56) References Cited

U.S. PATENT DOCUMENTS 3,697,949 A * 10/1972 Carter et al. ............... 714/763
2004/0098659 A1 * 5/2004 Bjerke et al. ............... 714/776
2004/0199860 A1 * 10/2004 Kim et al. ................... 714/801
2004/0221223 A1 * 11/2004 Yu et al. ..................... 714/800
2004/0255222 A1 * 12/2004 Kim et al. ................... 714/752
2005/0091570 A1 * 4/2005 Eroz et al. ................... 714/800
2005/0154958 A1 * 7/2005 Xia et al. .................... 714/752
2005/0246616 A1 * 11/2005 Choi et al. .................. 714/801
2005/0258987 A1 * 11/2005 Richardson .................. 341/50
2005/0278604 A1 * 12/2005 Yokokawa et al. .......... 714/758

OTHER PUBLICATIONS

Rao et al, Error-Control Coding for Computer Systems, Prentice-Hall, 1989, pp. 140, 194, 228.*

* cited by examiner

*Primary Examiner*—Stephen M. Baker
(74) *Attorney, Agent, or Firm*—Kenneth A. Haas

(57) ABSTRACT

A method for interlacing columns of different weights is proposed for a parity-check matrix H that results in good performing LDPC codes shortened or unshortened. Matrix H comprises a section $H_1$ and a section $H_2$, and wherein $H_1$ has a plurality of different column weights and comprises a plurality of sub-matrices where columns of at least one weight are substantially interlaced between the sub-matrices.

17 Claims, 5 Drawing Sheets

Column weight distribution of the parity check matrix with interlaced column weight in $H_1$. The code size is (2000, 1600).

100

Column weight distribution of the parity check matrix with non-interlaced column weight in $H_1$, i.e., the columns of the same weight are grouped together. The code size is (2000, 1600).

Column weight distribution of the parity check matrix with interlaced column weight in $H_1$. The code size is (2000, 1600).

200

METHOD AND APPARATUS FOR ENCODING AND DECODING DATA

FIELD OF THE INVENTION

The present invention relates generally to encoding and decoding data and in particular, to a method and apparatus for encoding and decoding data utilizing low-density parity-check (LDPC) codes.

BACKGROUND OF THE INVENTION

As described in U.S. patent application Ser. No. 10/839,995, which is incorporated by reference herein, a low-density parity-check (LDPC) code is a linear block code specified by a parity-check matrix H. In general, an LDPC code is defined over a Galois Field GF(q), $q \geq 2$. If q=2, the code is a binary code. As with all linear block codes, a k-bit information vector $s_{1 \times k}$ is generally encoded by the code generator matrix $G_{k \times n}$ to become an n-bit codeword $x_{1 \times n}$, and the code rate is r=k/n. The codeword x is transmitted through a noisy channel, and the received signal vector y is passed to the decoder to estimate the information vector $s_{1 \times k}$.

Given an n-dimensional space, the rows of G span the k-dimensional codeword subspace C, and the rows of the parity-check matrix $H_{m \times n}$ span the m-dimensional dual space $C^{\perp}$, where m=n−k. Since x=sG and $GH^T=0$, it follows that $xH^T=0$ for all codewords in subspace C, where "T" denotes matrix transpose. In the discussion of LDPC codes, this is generally written as $$Hx^T = 0^T, \quad (1)$$

where 0 is a row vector of all zeros, and the codeword x=[s p]=[$s_0, s_1, \ldots, s_{k-1}, p_0, p_1, \ldots, p_{m-1}$], where $p_0, \ldots p_{m-1}$ are the parity-check bits; and $s_0, \ldots s_{k-1}$ are the systematic bits, equal to the information bits within the information vector.

In a systematic code that maps k information bits to n coded bits, let the first k bits of the coded bits be the information bits. To make the code more flexible, shortening technique can be used to modify the code size. Shortening L bits modifies a (n, k) code to a lower rate (n−L, k−L) code utilizing part of the same H matrix. Without losing generality, in the following the shortened positions are assumed to be located in the first L information positions. When shortening L bits, the first L ($0 \leq L < k$) information bits are set to zero (logically or physically), and the corresponding zeros are removed from the coded bits after channel encoding. A code can be successively shortened to achieve a series of codes with descending code rates. In some encoders, leading zeros do not change the state of the encoder, so that the zeros do not have to be fed into the encoding circuit.

For an LDPC code, shortening by setting the first L information bits to zero can be accomplished in two equivalent ways. First, a k bit information vector (also known as systematic bits) can be set with the fist L bits being zero and the rest being the actual information bits to be encoded. The length k information vector can be fed into the encoder (which may be based on the unshortened (n−k)-by-n H matrix or the equivalent k-by-n generator matrix G), and the L zeros are subsequently stripped from the coded bits after encoding. Second, a shortened information vector may be passed to the encoder which encodes based on a shortened (n−k)-by-(n−L) H matrix with the first L columns removed, or the equivalent shortened (k−L)-by-(n−L) G matrix. In either case, the resulting shortened LDPC code(s) are likely to have poor performance because their weight distribution may be inferior to a code custom designed for that code rate and block size. It is not clear how to construct a shortened LDPC code that maintains good performance.

In order to use an LDPC code with good error-correcting performance, an appropriate low-density parity-check matrix H has to be defined. As is known in the art, better performance can be achieved by irregular rather than regular LDPC codes. It is found that irregular H matrices with good weight distribution have better performance than average, where the weight distribution specifies the fraction of columns with the given number of 1's, and the fraction of rows with the given number of 1's.

The term regular when used for an LDPC code means that all rows of H have a same number of 1's, and all the columns of H have a same number of 1's, where the number of 1's in a row or column is also called the weight of the row or column. Otherwise the LDPC code is considered irregular. In a narrower sense, the term regular can also be applied to either the rows or the columns (i.e., a matrix may have regular column weights, but irregular row weights), and can also be applied to a sub-matrix of a matrix (e.g., a submatrix of a matrix is regular when all the columns of the submatrix have the same column weight and all the rows of the submatrix have the same row weight). An example of applying irregular codes with good weight distribution for good performance is the digital video broadcasting satellite standard (DVB-S2) which defines multiple H matrices, each with the desired weight distribution for good performance at that code rate. The numbers of columns of each weight are shown in Table 1 for all the DVB-S2 code rates.

TABLE 1

Number of Columns of Various Weights in DVB-S2.

| Code Rate | 13 | 12 | 11 | 8 | 4 | 3 | 2 | 1 |
|---|---|---|---|---|---|---|---|---|
| 1/4 |  | 5400 |  |  |  | 10800 | 48599 | 1 |
| 1/3 |  | 7200 |  |  |  | 14400 | 43199 | 1 |
| 1/2 |  |  |  | 12960 |  | 19440 | 32399 | 1 |
| 3/5 |  | 12960 |  |  | 12960 | 25920 | 25919 | 1 |
| 2/3 | 4320 |  |  |  |  | 38880 | 21599 | 1 |
| 3/4 |  | 5400 |  |  |  | 43200 | 16199 | 1 |
| 4/5 |  |  | 6480 |  |  | 45360 | 12959 | 1 |
| 5/6 | 5400 |  |  |  |  | 48600 | 10799 | 1 |
| 8/9 |  |  |  |  | 7200 | 50400 | 7199 | 1 |
| 9/10 |  |  |  |  | 6480 | 51840 | 6479 | 1 |

In contrast to the DVB-S2 example, some code designs have only one H matrix and use shortening to achieve code rates, but the codes after shortening do not perform well. For instance, the portion of H corresponding to the information bits (denoted $H_1$) is regular (and therefore the entire matrix is sometimes referred to as semi-regular), and after shortening the code weight distribution is poor compared to a good custom design. Therefore, a need exists for a method and apparatus for encoding and decoding data utilizing an H matrix that performs well with or without shortening.

DETAILED DESCRIPTION OF THE DRAWINGS

Figure 1:
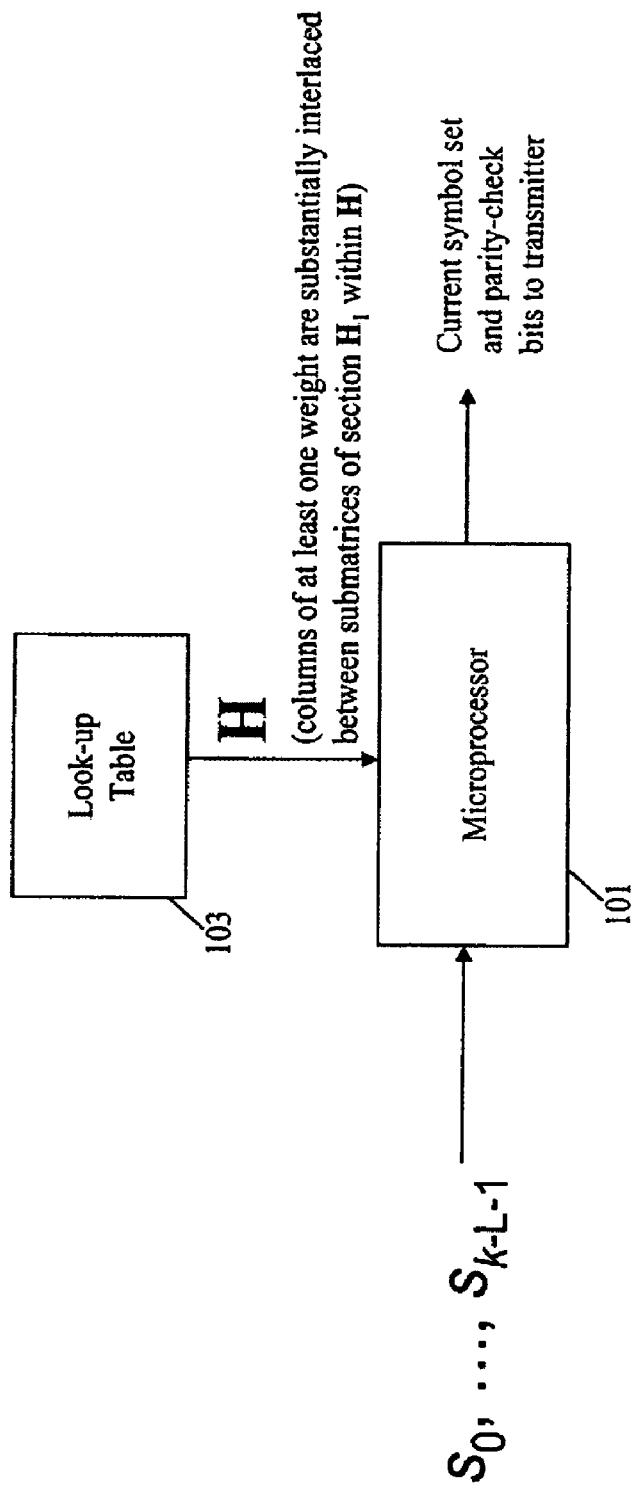
FIG. 1 is a block diagram of an encoder in accordance with the preferred embodiment of the present invention.

To address the above-mentioned need, a method and apparatus for encoding and decoding data is provided herein. In particular, parity-check bits are provided that are generated via a parity-check matrix H that exhibits good performance when shortened. The H matrix comprises a section $H_1$ corresponding to the information bits and a section $H_2$ corresponding to the parity-check bits The columns within $H_1$ have irregular weights, i.e., at least two different column weights exist within $H_1$. The section $H_1$ comprises a plurality of sub-matrices where columns of at least one given weight are substantially interlaced between the sub-matrices.

The present invention encompasses a method for operating a transmitter that generates parity-check bits ($p_0, \ldots, p_{m-1}$) based on a current symbol set $s=(s_0, \ldots, s_{k-L-1})$. The method comprises the steps of receiving the current symbol set $s=(s_0, \ldots, s_{k-L-1})$, where L is a number of bits the entire current symbol set is shortened by to obtain the current symbol set, $0<=L<=k-1$, and k is the length of the entire current symbol set when unshortened, and using a matrix H to determine the parity-check bits. In the preferred embodiment of the present invention H comprises a section $H_1$ and a section $H_2$, and $H_1$ comprises a plurality of sub-matrices between which columns of at least one weight are substantially interlaced. The parity-check bits are transmitted along with the current symbol set. Note that the current symbol set may also be called an information vector.

The present invention encompasses a method for operating a receiver that estimates a current symbol set $s=(s_0, \ldots, s_{k-L-1})$. The method comprises the steps of receiving a signal vector $y=(y_0 \ldots y_{n-L-1})$, $0<=L<=k-1$ and using a matrix H to estimate the current symbol set $(s_0, \ldots, s_{k-L-1})$. In the preferred embodiment of the present invention H comprises a section $H_1$ and a section $H_2$, and $H_1$ comprises a plurality of sub-matrices between which columns of at least one weight are substantially interlaced.

The present invention additionally encompasses an apparatus comprising storage means for storing a matrix H, and a microprocessor using a matrix H to determine the parity-check bits. In the preferred embodiment of the present invention H comprises a section $H_1$ and a section $H_2$, and $H_1$ comprises a plurality of sub-matrices between which columns of at least one weight are substantially interlaced. The apparatus additionally comprises a transmitter for transmitting the parity-check bits along with the current symbol set.

The present invention additionally encompasses an apparatus comprising storage means for storing a matrix H, a receiver for receiving a signal vector $y=(y_0 \ldots y_{n-L-1})$, $0<=L<=k-1$, and a microprocessor using the matrix H to determine a current symbol set $(s_0, \ldots, s_{k-L-1})$. H comprises a section $H_1$ and a section $H_2$, and $H_1$ comprises a plurality of sub-matrices between which columns of at least one weight are substantially interlaced between the sub-matrices.

Turning now to the drawings, wherein like numerals designate like components, FIG. 1 is a block diagram of encoder 100 in accordance with a first embodiment of the present invention. As shown, encoder 100 comprises microprocessor 101 and lookup table 103. In the first embodiment of the present invention microprocessor 101 comprises a digital signal processor (DSP), such as, but not limited to MSC8100 and DSP56300 DSPs. Additionally, lookup table 103 serves as storage means to store a matrix, and comprises read-only memory, however, one of ordinary skill in the art will recognize that other forms of memory (e.g., random-access memory, magnetic storage memory, etc.) may be utilized as well. In a second embodiment, the functionality of the microprocessor 101 and the lookup table 103 can be incorporated into an application specific integrated circuit (ASIC) or field programmable gate array (FPGA). In particular, the lookup table 103 can be implemented in a form of memory corresponding to the existence or non-existence of signal paths in a circuit.

As discussed above, encoded data is generally output as a plurality of parity-check bits in addition to the systematic bits, where together the parity-check and systematic bits form a codeword x. In the first embodiment of the present invention a parity-check matrix H is stored in lookup table 103, and is accessed by microprocessor 101 to solve the Equation (1). In particular, microprocessor 101 determines appropriate values for the parity-check bits ($p_0, \ldots, p_{m-1}$) based on the current symbol set $s=(s_0, \ldots, s_{k-L-1})$ and the parity-check matrix H, $0 \leq L < k$. When L=0, the code is unshortened; when L>0, the code defined by H is shortened by L bits. Therefore, k is the length of the entire current symbol set when unshortened. The parity-check bits and the symbol set are then passed to a transmitter transmitted to a receiver.

For a code that takes k information bits and generates n code bits, the H matrix is divided into two parts $H=[H_1 \ H_2]$, where $H_1$ has size m-by-k and $H_2$ has size m-by-m, m=n−k. $H_1$ corresponds to the unshortened information bits, and $H_2$ corresponds to the parity bits, so that $[(H_1)_{m \times k} \ (H_2)_{m \times m}] [(s)_{1 \times k} \ (p)_{1 \times m}]^T = 0$. When shortening the first L positions of s, the first L columns of $H_1$ are essentially removed.

Section $H_2$ can be regular or irregular, have any structure, or be randomly constructed. $H_2$ may be described as non-deterministic if the value of each entry is not defined or determined to have a particular structure, or is random with certain design constraints. A preferred $H_2$ is similar to the $H_2$ described in application Ser. No. 10/839,995.

$$H_2 = [h \ H_2'] \qquad (1)$$

$$= \begin{bmatrix} h_0 & 1 & & & & & & & & \\ h_1 & 1 & 1 & & & & & & & \\ \vdots & & 1 & 1 & & & 0 & & & \\ \vdots & & & 1 & 1 & & & & & \\ \vdots & & & & 1 & 1 & & & & \\ \vdots & & & & & 1 & 1 & & & \\ \vdots & & & 0 & & & 1 & 1 & & \\ \vdots & & & & & & & 1 & 1 & \\ \vdots & & & & & & & & \ddots & \ddots \\ \vdots & & & & & & & & 1 & 1 \\ \vdots & & & & & & & & & 1 & 1 \\ h_{m-1} & & & & & & & & & & 1 \end{bmatrix},$$

where h has odd weight>2. For example, $h=[1 \ 0 \ 0 \ 0 \ 1 \ 0 \ 0 \ 0 \ 1 \ 0 \ \ldots \ 0]^T$.

Another example of $H_2$ is approximately lower triangular, with all columns having weight 2 except last column having weight 1. Mathematically an entry in the m-by-m $H_2$ matrix is a 1 for row i, column j if i=j, and i=j+1, 0<=i<=m−1, 0<=j<=m−1.

$$H_2 = \begin{bmatrix} 1 & & & & & & & & & \\ 1 & 1 & & & & & & & & \\ & 1 & 1 & & & 0 & & & & \\ & & 1 & 1 & & & & & & \\ & & & 1 & 1 & & & & & \\ & & & & 1 & 1 & & & & \\ & & & & & 1 & 1 & & & \\ & 0 & & & & & 1 & 1 & & \\ & & & & & & & 1 & \ddots & \\ & & & & & & & & \ddots & 1 \\ & & & & & & & & 1 & 1 \\ & & & & & & & & & 1 & 1 \end{bmatrix}.$$

As discussed above, section $H_1$ has a particular column weight structure defined. For irregular codes that have better performance than regular codes, the columns of various weight can be arranged in any order without affecting performance, since permuting the order of code bits does not affect error-correcting performance. The column weights are therefore typically distributed with no particular order. For example, all columns of the same weight may be grouped together. When the leading L columns of H (and therefore the leading L columns of submatrix $H_1$) are effectively removed through shortening, the resulting weight distribution can result in poor performance.

To achieve good performance when shortened, the section $H_1$ can be column-wise divided into a plurality of submatrices between which columns of at least one weight are substantially interlaced. Interlacing between sub-matrices is based on a desired column weight distribution for the submatrices, which determines the weight distribution of the entire H matrix after shortening. The interlacing between the submatrices is uniform if the desired column weight distribution is the same for all sub-matrices of $H_1$. The interlacing between the matrices is non-uniform if the desired column weight distribution is different for at least two submatrices. Within a submatrix, the columns of different weights may be interlaced such that the columns of different weights are spread predominantly uniformly over the submatrix.

In the preferred embodiment of the present invention, the columns of different weights are uniformly or non-uniformly interlaced between sub-matrices, so that the resulting shortened matrix can have much better weight distribution, and therefore better error-correcting performance. Let $H_1$ be irregular in that it has two or more distinct columns weights (e.g., 3 and 10 ones in each column of $H_1$). The columns of $H_1$ are further divided into two sections (submatrices), $H_1=[H_{1a}\ H_{1b}]$, where $H_{1a}$ is an m-by-L matrix (i.e., first L columns of $H_1$) corresponding to the first L systematic bits and $H_{1b}$ is a m-by-(k−L) matrix (i.e., remaining k−L columns of $H_1$) corresponding to the remaining (k−L) systematic bits $s_b$. When L=0, the code is unshortened, i.e., $H_{1a}$ is empty and $H_{1b}=H_1$. When L>0, the columns of different weights are interlaced between $H_{1a}$ and $H_{1b}$, so that after shortening L bits (i.e., effectively removing $H_{1a}$ from H), the resulting code defined by $[H_{1b}\ H_2]$ has a good weight distribution.

When encoding, the encoder first pretends L zeros to the current symbol set $s_b$ of length (k−L). Then the zero-padded information vector $s=[0_L\ s_b]$ is encoded using H as if unshortened to generate parity bit vector p (length m). After removing the prepended zeros from the current symbol set, the code bit vector $x=[s_b\ p]$ is transmitted over the channel. The zeros may be both added and removed by microprocessor 101. This encoding procedure is equivalent to encoding the current symbol set $s_b$ using the shortened matrix $[H_{1b}\ H_2]$ to determine the parity-check vector p. Microprocessor 101 will use the appropriate portion of H provided by look-up table 103 based on the amount of shortening L or equivalently the size of the current symbol set k−L−1.

The simple example was described with two regions of $H_1$, but $H_1$ can be further subdivided with the columns of a given weight interlaced over smaller submatrices. The column weight interlacing between submatrices is performed such that after shortening the resulting parity check matrices all have good weight distributions. In addition, an $H_1$ subdivided for a given set of L may be shortened by any amount, not just the values that match the submatrix boundaries. For example, $H_{1a}$ may comprise a first number of columns, and the amount of shortening L can be any number from zero to k−1 inclusive, including L equal to the first number of columns.

The interlacing between sub-matrices may be performed in a uniform or non-uniform manner. Uniform interlacing has a desired weight distribution that preserves the approximate column weight distribution of $H_1$ for each submatrix of $H_1$. Within each submatrix of $H_1$, the columns can be positioned in any order. For example, if $H_1$ has approximately 25% weight x1 and 75% weight x2 columns, $H_{1a}$ and $H_{1b}$ can each have approximately 25% weight x1 and 75% weight x2 columns by interlacing one weight x1 column with three weight x2 columns throughout $H_1$. Alternatively, the columns can be arranged by placing approximately round(0.25*width($H_{1a}$)) weight x1 column followed by round(0.75*width($H_{1a}$)) weight x2 columns in $H_{1a}$. In both cases $H_{1b}$ will have a column weight distribution as $H_{1a}$, and the arrangement of the columns in $H_{1b}$ does not affect performance unless the code is further shortened (i.e., $H_{1b}$ is divided into additional submatrices). Uniform interlacing generally results in sub-optimal weight distributions for the shortened codes.

Non-uniform interlacing attempts to match a desired non-uniform weight distribution for each region of $H_1$. For example, if $H_1$ has a weight distribution of 25% weight x1 and 75% weight x2, but a 50% shortened code with $H_{1b}$ has a desired weight distribution of 50% weight x1 and 50% weight x2, $H_{1b}$ can achieve the desired distribution by non-uniform interlacing the columns between $H_{1a}$ and $H_{1b}$. In this case, approximately round(0.25*width($H_1$)−0.5*width($H_{1b}$)) weight x1 columns and approximately round(0.75*width($H_1$)−0.5*width($H_{1b}$)) weight x2 columns are placed in $H_{1a}$. With this non-uniform interlacing $H_{1b}$ has the desired weight distribution where 0.5*width($H_{1b}$) columns have weight x1 and 0.5*width($H_{1b}$) columns have weight x2. Further, this column weight distribution within $H_1$ can be achieved by interlacing approximately one weight x2 column with zero weight x1 columns in $H_{1a}$ (i.e., all of $H_{1a}$ are weight x2 columns) and (if desired) by alternating approximately one weight x2 column with one weight x1 column in $H_{1b}$. If multiple shortened code rates are to be supported, then the non-uniform interlacing with columns of various weight scattered among the multiple sub-matrices is desirable in providing better performance for all shortened code rates. Although the example discusses two submatrices of $H_1$, the same procedure can be carried out for other number of submatrices. As shown in the example, the interlacing procedure strives to match the target column weight distribution of the resulting H matrix after shortening. Depending on the desired column weight distribution of the submatrices, columns of a given weight may not appear in all submatrices, and there may be column weights that are not distributed to different submatrices.

Algorithm Pseudocode

The following Matlab™ code is included to illustrate how a good column weight distribution may be found for a given code rate and code size using the desired weight distributions.

```
% get optimized degree distribution, dv = maximum column weight,
rate is code rate
vDeg = getDegDist(rate, dv);
% get the number of variable nodes of each weight, N is the number
of columns in H
vNodes    =    round(  N    *    vDeg(2, :)./vDeg(1, :)
/sum(vDeg(2, :)./vDeg(1, :)));
function [vDeg] = getDegDist( rate, dv)
% vDeg(1,i):     col weight i
% vDeg(2,i):     fraction of edges linked to variable node of
weight vDeg(1,i)
% vDeg(3,i):     fraction of variable nodes of weight vDeg(1,i)
if ( abs(rate -1/2)<1e-4)
      if (dv == 4)
           vDeg = [    2    0.38354     (0.54883)
                       3    0.04237     (0.04042)
                       4    0.57409     (0.41075)]';
      elseif (dv == 11)
           vDeg = [    2    0.288212    (0.50437)
                       3    0.256895    (0.29971)
                       5    0.0285565   (0.01999)
                       6    0.15190     (0.088608)
                       11   0.274437    (0.087321)]';
      end
elseif ( abs(rate-2/3)<1e-4)
      if ( dv == 10)
           vDeg = [    2 0.1666670000   (0.33000059795989)
                       3 0.3679650000   (0.48571370868582)
                       10 0.4653680000  (0.18428569335429)]';
      end
elseif ( abs(rate-4/5)<1e-4)
      if (dv == 10)
           vDeg = [    2 0.1000000000   (0.19999992000003)
                       3 0.4714290000   (0.6285717485713)
                       10 0.4285710000  (0.17142833142867) ]';
      end
end
```

The following Matlab™ code illustrates how to interlace the column weights within a submatrix, which is beneficial if a submatrix needs to be further divided. Note that s is the vector of column weights, and z1 and z2 are dependent on the particular column weight distribution within the submatrix.

```
% length1: number of columns in the submatrix
% total_length = z1*z2;
temp         = [s(1:length1) -ones(1,total_length-length1)];
submatrix1   = reshape( reshape( temp, z1, z2)', 1, z1*z2);
idx          = find(submatrix1<0);
submatrix1(idx)  = [ ];
```

EXAMPLE

Figure 2:
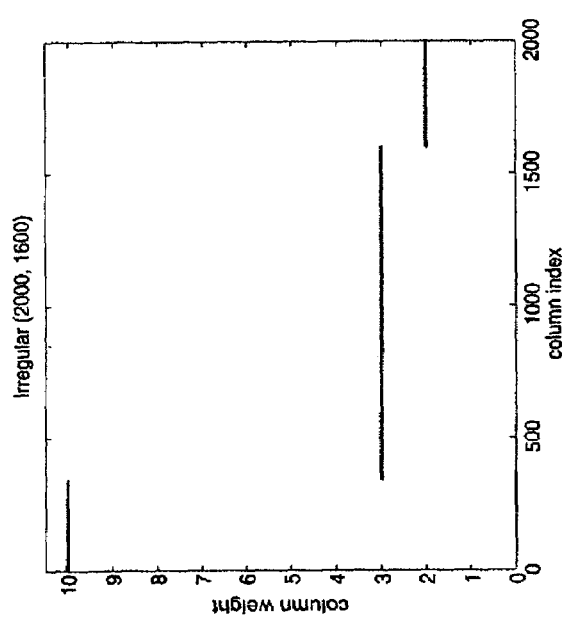
FIG. 2 is a plot of column weight distribution for a non-interlaced parity-check matrix.

An example is used to illustrate the procedure described above. For a code of size (2000, 1600), an H matrix is found with column weights of 2, 3, and 10. The column weight distribution of the non-interlaced parity-check matrix $H_{non}$ is plotted in FIG. 2. After column interlacing of the $H_1$ portion, the column weight distribution of the resulting parity-check matrix $H_{inter}$ is plotted in FIG. 3, and listed below. Matrix $H_{inter}$ is the same as matrix $H_{non}$ except that the column permutation is introduced. Note that in FIG. 2 and FIG. 3 the section $H_2$ is preserved and has the preferred structure illustrated in (1). Thus the last 399 columns have weight 2 in both FIG. 2 and FIG. 3.

When shortening $H_{inter}$, the resulting matrix still maintains good column weight distributions. As an example, given target weight distributions of H $$vDeg = [2 \quad 0.1666670000 \quad (0.33000059795989)$$
$$3 \quad 0.3679650000 \quad (0.48571370868582)$$
$$10 \quad 0.4653680000 \quad (0.18428569335429)]';$$

where the first column above indicates desired column weight, the third column above indicates the number of columns with the given weight, the non-uniform insertion algorithm yields the column weight distributions of derived rate ⅔ code in Table 2. Similar procedure is used to find the desired column weight distribution of the rate ½ code (after shortening the original rate ⅘ code) in Table 2. For comparison, the weight distributions for $H_{non}$ and $H_{u\_inter}$ (with uniform interlacing) are given in Tables 3 and 4, respectively. Note that in all cases section $H_2$ has 399 weight 2 and one weight 3 columns, and section $H_1$ has one weight 2 column.

The tables show that the two shortened codes of $H_{non}$ would have no weight 10 columns, resulting in inferior performance than those shortened from $H_{inter}$ and $H_{u\_inter}$. Both $H_{inter}$ and $H_{u\_inter}$ are examples of using column interlacing to achieve better weight distribution and therefore better performance when shortening. One of ordinary skill in the art will recognize that other interlaced H matrices can be built with the described procedure.

TABLE 2

Number of Columns of Various Weight in $H_{inter}$ and its derived codes.

| Code Rate | 10 | 3 | 2 |
|---|---|---|---|
| ½ | 191 | 217 | 400 |
| ⅔ | 221 | 583 | 400 |
| ⅘ | 343 | 1257 | 400 |

TABLE 3

Number of Columns of Various Weight in $H_{non}$ and its derived codes.

| Code Rate | 10 | 3 | 2 |
|---|---|---|---|
| ½ | 0 | 400 | 400 |
| ⅔ | 0 | 800 | 400 |
| ⅘ | 343 | 1257 | 400 |

TABLE 4

Number of Columns of Various Weight in $H_{inter}$ and its derived codes.

| Code Rate | 10 | 3 | 2 |
|---|---|---|---|
| 1/2 | 84 | 316 | 400 |
| 2/3 | 168 | 632 | 400 |
| 4/5 | 343 | 1257 | 400 |

Decoder

Figure 4:
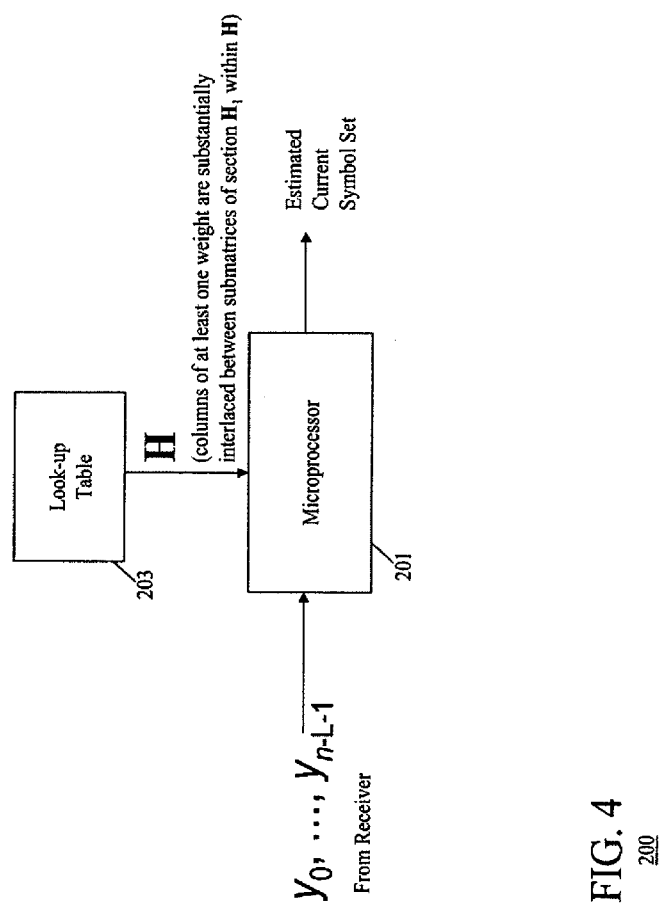
FIG. 4 is a block diagram of a decoder.

FIG. 4 is a block diagram of decoder 200 in accordance with one embodiment of the present invention. As shown, decoder 200 comprises microprocessor 201 and lookup table 203. In a first embodiment of the present invention microprocessor 201 comprises a digital signal processor (DSP), such as, but not limited to MSC8100 and DSP56300 DSPs. Additionally, lookup table 203 acts as storage means for storing matrix H, and comprises read-only memory. However, one of ordinary skill in the art will recognize that other forms of memory (e.g., random-access memory, magnetic storage memory, etc.) may be utilized as well. In a second embodiment, the functionality of the microprocessor 201 and the lookup table 203 can be incorporated into an application specific integrated circuit (ASIC) or field programmable gate array (FPGA). In particular, the lookup table 203 can be implemented in a form of memory corresponding to the existence or non-existence of signal paths in a circuit.

The received signal vector (received via a receiver) $y=(y_0 \ldots y_{n-L-1})$ corresponds to the codeword x transmitted through a noisy channel, where the encoded data x, as discussed above, is a codeword vector. The code is unshortened when L=0, and shortened by L bits when 0<L<k. In the first embodiment of the present invention a parity-check matrix H is stored in lookup table 203, and is accessed by microprocessor 201 to decode y and estimate the current symbol set s (i.e., the current symbol set $(s_0, \ldots, s_{k-L-1})$). In particular, microprocessor 201 estimates the current symbol set $(s_0, \ldots, s_{k-L-1})$ based on the received signal vector $y=(y_0 \ldots y_{n-L-1})$ and the parity-check matrix H. As discussed above, H comprises a section $H_1$ with certain structure such as irregular column weights and a section $H_2$.

As is well known in the art, there are many ways the decoder 200 can use the parity-check matrix H in the microprocessor 201 for decoding. One such way is to perform a vector-matrix multiplication with H to determine a likely error pattern. Another such way is to use H to construct a bipartite graph where the edges in the graph correspond to the 1's in H, and to iteratively process y on the bipartite graph.

Figure 5:
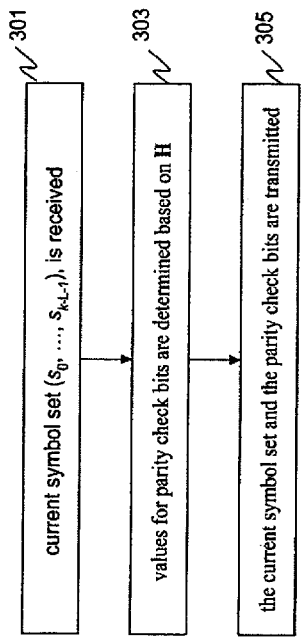
FIG. 5 is a flow chart showing the operation of the encoder of FIG. 1 in accordance with the preferred embodiment of the present invention.

FIG. 5 is a flow chart showing the operation of encoder 100, and in particular, microprocessor 101. The logic flow begins at step 301 where a current symbol set $(s_0, \ldots, s_{k-L-1})$ is received. At step 303, values of parity-check bits are determined based on the current symbol set and H. In particular, the parity-check bits $p_0, \ldots, p_{m-1}$ are determined as described above. At step 305 the current symbol set and the parity-check bits are transmitted.

Figure 6:
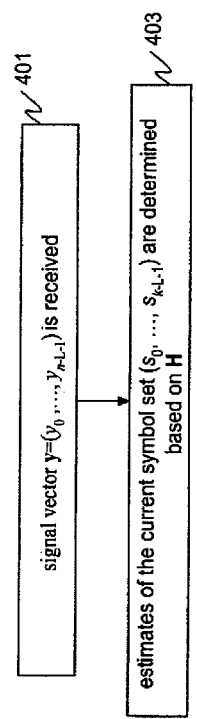
FIG. 6 is a flow chart showing operation of the decoder of FIG. 4 in accordance with the preferred embodiment of the present invention.

FIG. 6 is a flow chart showing the operation of decoder 200, and in particular, microprocessor 201. The logic flow begins at step 401 where the received signal vector $y=(y_0, \ldots, y_{n-L-1})$ is received. At step 403, estimates of the current symbol set s (i.e., the current symbol set $(s_0, \ldots, s_{k-L-1})$) are determined based on H. As is well known in the art, there are many ways the decoder 200 can use the parity-check matrix H in the microprocessor 201 for decoding. One such way is to perform a vector-matrix multiplication with H to determine a likely error pattern. Another such way is to use H to construct a bipartite graph where the edges in the graph correspond to the 1's of H, and to iteratively process y on the graph.

Figure 3:
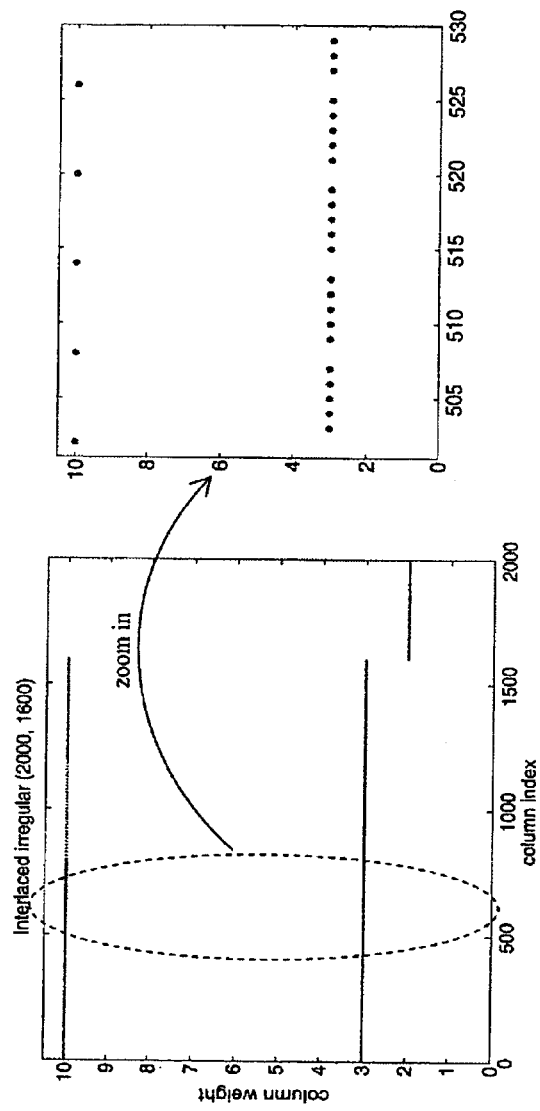
FIG. 3 is a plot of column weight distribution of an interlaced parity-check matrix.

Presented below is the column weight distribution of the irregular (2000, 1600) H matrix after interlacing the $H_1$ section (i.e., $H_{inter}$, whose column weight distribution is shown in FIG. 3). The H matrix is described in a list format below. The list format is composed of three parts:

Part1: matrix size, i.e., number of columns and number of rows;

Part2: column weight of each column starting from the first column;

Part3: location of 1's in each column starting from the first column. Each line contains the location of 1's of a column.

2000 400
10 3 3 3 3 3 3 10 3 3 3 3 3 3 10 3 3 3 3 3 3 10 3 3 3 3
3 10 3 3 3 3 3 3 10 3 3 3 3 3
3 10 3 3 3 3 3 3 10 3 3 3 3 3 3 10 3 3 3 3 3 3 10 3 3 3 3
3 3 10 3 3 3 3 3 3 10 3 3 3 3
3 3 10 3 3 3 3 3 3 10 3 3 3 3 3 3 10 3 3 3 3 3 3 10 3 3 3
3 3 3 10 3 3 3 3 3 3 10 3 3 3
3 3 3 10 3 3 3 3 3 3 10 3 3 3 3 3 3 10 3 3 3 3 3 3 10 3 3
3 3 3 3 10 3 3 3 3 3 3 10 3 3
3 3 3 3 10 3 3 3 3 3 3 10 3 3 3 3 3 3 10 3 3 3 3 3 3 10 3
3 3 3 3 3 10 3 3 3 3 3 3 10 3
3 3 3 3 3 10 3 3 3 3 3 3 10 3 3 3 3 3 3 10 3 3 3 3 3 3 10
3 3 3 3 3 3 10 3 3 3 3 3 3 10
3 3 3 3 3 3 10 3 3 3 3 3 3 10 3 3 3 3 3 3 10 3 3 3 3 3 3 10
3 3 3 3 3 3 10 3 3 3 3 3
10 3 3 3 3 3 3 10 3 3 3 3 3 3 10 3 3 3 3 3 3 10 3 3 3 3
3 10 3 3 3 3 3 3 10 3 3 3 3 3
3 10 3 3 3 3 3 3 10 3 3 3 3 3 3 10 3 3 3 3 3 3 10 3 3 3 3
3 3 10 3 3 3 3 3 3 10 3 3 3 3
3 3 10 3 3 3 3 3 3 10 3 3 3 3 3 3 10 3 3 3 3 3 3 10 3 3 3
3 3 3 10 3 3 3 3 3 3 10 3 3 3
3 3 3 10 3 3 3 3 3 3 10 3 3 3 3 3 3 10 3 3 3 3 3 3 10 3 3
3 3 3 3 10 3 3 3 3 3 3 10 3 3
3 3 3 3 10 3 3 3 3 3 3 10 3 3 3 3 3 3 10 3 3 3 3 3 3 10 3 3 3 3
10 3 3 3 3 3 10 3 3 3 3 3 10
3 3 3 3 10 3 3 3 3 3 3 10 3 3 3 3 3 3 10 3 3 3 3 3 3 10 3 3
3 10 3 3 3 3 3 10 3 3 3 3 3
10 3 3 3 3 3 3 10 3 3 3 3 3 3 10 3 3 3 3 3 3 10 3 3 3 3 10 3 3
3 3 3 10 3 3 3 3 3 10 3 3 3
3 3 10 3 3 3 3 3 3 10 3 3 3 3 3 3 10 3 3 3 3 3 3 10 3 3 3 3 10
3 3 3 3 10 3 3 3 3 3 10 3
3 3 3 10 3 3 3 3 3 3 10 3 3 3 3 3 3 10 3 3 3 3 3 3 10 3 3 3 3
3 10 3 3 3 3 3 10 3 3 3 3
10 3 3 3 3 3 3 10 3 3 3 3 3 3 10 3 3 3 3 3 3 10 3 3 3 3 10 3 3
3 3 3 3 3 3 3 3 10 3 3
3 3 3 3 3 3 3 3 3 3 10 3 3 3 3 3 3 3 3 3 3 3 3 3 10 3 3 3
3 3 3 3 3 3 3 3 3 10 3 3 3
3 3 3 3 3 3 3 3 10 3 3 3 3 3 3 3 3 3 3 3 3 3 3 3 10 3 3 3 3 3 3 3
3 3 3 3 3 3 3 3 10 3 3 3 3 3
3 3 3 3 3 3 10 3 3 3 3 3 3 3 3 3 3 3 3 10 3 3 3 3 3 3 3 3 3
3 3 3 10 3 3 3 3 3 3 3 3 3
3 3 10 3 3 3 3 3 3 3 3 3 3 3 3 10 3 3 3 3 3 3 3 3 3 3 3 3
10 3 3 3 3 3 3 3 3 3 3 3

10 3 3 3 3 3 3 3 3 3 3 3 10 3 3 3 3 3 3 3 3 3 3 3 10 3
3 3 3 3 3 3 3 3 3 3 10 3 3
3 3 3 3 3 3 3 3 3 3 10 3 3 3 3 3 3 3 3 3 3 3 10 3 3 3 3
3 3 3 3 3 3 3 10 3 3 3 3 3 3
3 3 3 3 3 3 10 3 3 3 3 3 3 3 3 3 3 3 10 3 3 3 3 3 3 3 3 3
3 3 3 10 3 3 3 3 3 3 3 3 3 3
3 3 10 3 3 3 3 3 3 3 3 3 3 3 10 3 3 3 3 3 3 3 3 3 3 3 10
3 3 3 3 3 3 3 3 3 3 3 10
3 3 3 3 3 3 3 3 3 3 3 3 10 3 3 3 3 3 3 3 3 3 3 3 3
10 3 3 3 3 3 3 3 3 3 3 3 10 3 3 10
3 3 10 3 3 10 3 3 10 3 3 10 3 3 10 3 3 10 3 3 10 3 3 10 3
3 10 3 3 3 10 3 3 10 3
3 10 3 3 10 3 3 10 3 3 10 3 3 10 3 3 10 3 3 10 3 3 10 3 3
10 3 3 10 3 3 10 3 3 10 3 2
10 3 10 3 10 3 10 3 103 10 3 10 3 10 3 10 3 10 3 10 3 10
3 10 3 10 3 10 3 10 3 10 3
10 3 10 3 10 3 10 3 10 3 10 3 10 3 10 3 10 3 10 3 10 3 10 3 10
3 10 3 10 3 10 3 10 3 10 3
10 3 10 3 10 3 10 3 10 3 10 3 10 3 10 3 10 3 10 3 10 3 10 3 10
3 10 3 10 3 10 3 10 3 10 3
10 3 10 3 10 3 10 3 10 3 10 3 10 3 10 3 10 3 10 3 10 3 10 3 10
3 10 3 10 3 10 3 10 3 10 3
10 3 10 3 10 3 10 3 10 3 10 3 10 3 10 3 10 3 10 3 10 3 10 3 10
3 10 3 10 3 10 3 10 3 10 3
10 3 10 3 10 3 10 3 10 3 10 3 10 3 10 3 10 3 10 3 10 3 10 3 10
3 10 3 10 3 10 3 10 3 10 3
10 3 10 3 10 3 10 3 10 3 10 3 10 3 10 3 10 3 10 3 10 3 10 3 10
3 10 3 10 3 10 3 10 3 10 3
10 3 10 3 10 3 10 3 10 3 10 3 10 3 10 3 10 3 10 3 10 3 10 3 10
3 10 3 10 3 10 3 10 3 10 3
10 3 10 3 10 3 10 3 10 3 10 3 10 3 10 3 10 3 10 3 10 3 10 3 10
3 10 3 10 3 10 3 10 3 10 3
10 3 10 3 10 3 10 3 10 3 10 3 10 3 10 3 10 3 10 3 10 3 10 3 10
3 2 2 2 2 2 2 2 2 2 2 2 2
2 2 2 2 2 2 2 2 2 2 2 2 2 2 2 2 2 2 2 2 2 2 2 2 2 2 2 2
2 2 2 2 2 2 2 2 2 2 2 2 2
2 2 2 2 2 2 2 2 2 2 2 2 2 2 2 2 2 2 2 2 2 2 2 2 2 2 2 2
2 2 2 2 2 2 2 2 2 2 2 2 2
2 2 2 2 2 2 2 2 2 2 2 2 2 2 2 2 2 2 2 2 2 2 2 2 2 2 2 2
2 2 2 2 2 2 2 2 2 2 2 2 2
2 2 2 2 2 2 2 2 2 2 2 2 2 2 2 2 2 2 2 2 2 2 2 2 2 2 2 2
2 2 2 2 2 2 2 2 2 2 2 2 2
2 2 2 2 2 2 2 2 2 2 2 2 2 2 2 2 2 2 2 2 2 2 2 2 2 2 2 2
2 2 2 2 2 2 2 2 2 2 2 2 2
2 2 2 2 2 2 2 2 2 2 2 2 2 2 2 2 2 2 2 2 2 2 2 2 2 2 2 2
2 2 2 2 2 2 2 2 2 2 2 2 2
2 2 2 2 2 2 2 2 2 2 2 2 2 2 2 2 2 2 2 2 2 2 2 2 2 2 2 2
2 2 2 2 2 2 2 2 2 2 2 2 2
2 2 2 2 2 2 2 2 2 2 2 2 2 2 2 2 2 2 2 2 2 2 2 2 2 2 2 2
2 2 2 2 2 2 2 2 2 2 2 2 2
2 2 2 2 2 2 2 2 2 2 2 2 2 2 2 2 2 2 2 2 2 2 2 2 2 2 2 2
11 74 79 144 157 175 200 209 275 345
36 241 316
89 130 290
19 298 306
44 196 219
139 269 304
79 117 226
12 69 85 101 158 191 265 310 334 346
57 227 363
123 221 378
92 106 119
96 110 134
128 319 345
227 262 330
14 19 87 230 343 357 359 364 373 383
67 158 365

95 142 165
270 316 364
159 183 283
87 268 371
7 97 305
53 73 82 208 216 249 301 340 380 399
282 330 336
84 348 354
151 227 332
77 192 250
74 205 363
16 328 362
26 41 100 167 219 246 257 325 327 382
125 337 386
4 69 176
113 197 334
22 185 294
35 315 370
236 368 381
27 83 177 194 217 237 268 296 299 398
3 293 343
159 277 280
20 76 144
42 186 395
16 36 386
34 265 355
13 55 64 78 110 178 181 287 307 316
59 150 231
179 303 328
47 86 226
167 235 342
3 310 374
167 242 261
128 147 160 176 259 265 282 309 360 393
21 55 348
27 167 376
114 229 275
88 318 370
104 134 304
91 202 399
33 67 72 90 159 269 303 306 308 372
19 103 256
64 264 382
73 239 362
79 164 213
150 254 343
198 217 245
16 42 71 183 201 230 264 321 348 374
52 85 112
119 222 278
177 263 394
95 256 269
231 234 248
293 319 334
63 114 134 154 163 239 267 273 326 371
279 298 322
53 126 287
248 301 351
225 303 363
117 305 377
40 132 320
14 75 117 133 169 205 207 225 247 258
4 84 126
110 190 265
3 165 186
237 253 396
57 211 232

53 111 192
62 70 118 130 138 188 235 243 350 392
40 120 385
204 218 319
147 247 391
179 220 314
127 199 389
26 297 342
60 121 199 203 251 261 292 318 336 375
94 246 342
7 151 324
48 208 326
64 118 276
73 144 347
134 258 391
17 48 116 127 131 185 215 288 331 354
176 300 355
146 188 380
42 68 319
5 156 311
57 201 206
92 309 332
1 18 56 91 146 164 294 328 332 369
17 233 249
96 173 275
134 333 363
98 228 351
108 121 348
45 135 249
15 44 69 95 124 173 293 304 368 379
92 243 334
317 339 361
40 241 310
58 114 286
131 223 367
85 234 291
7 139 165 196 232 274 298 311 338 342
41 205 394
115 133 329
234 376 395
93 214 231
94 314 376
162 197 294
61 66 84 89 111 227 256 312 314 353
33 86 390
63 82 135
140 168 311
38 153 359
98 106 393
8 218 325
8 20 171 238 270 278 324 333 337 384
47 96 121
224 276 343
27 84 236
3 103 333
92 311 390
142 220 253
23 93 96 125 202 212 228 297 349 383
37 83 258
87 178 310
41 232 290
81 99 217
116 152 230
271 296 376
58 106 126 226 229 263 323 355 361 367
175 221 247
17 206 289

295 371 380
10 45 337
191 212 300
5 153 214
4 94 102 150 161 213 266 286 295 335
34 245 259
120 134 313
0 174 257
9 116 290
145 186 285
6 353 380
29 51 80 98 109 113 254 300 390 395
66 281 313
5 91 267
18 53 156
190 205 377
50 173 177
0 59 163
28 49 68 107 174 221 223 376 389 397
80 110 274
31 168 257
286 367 373
174 226 246
257 333 372
23 47 83
9 243 639 143 162 214 220 370 391
20 309 317
129 228 394
57 192 223
70 137 393
8 246 351
90 311 398
77 10 3 170 184 211 231 245 253 271 351
132 220 332
186 208 307
66 85 230
82 227 244
30 137 189
146 304 359
22 46 97 151 175 180 222 236 277 281
195 304 311
0 30 157
251 264 354
20 161 201
63 167 317
22 48 266
10 34 50 81 129 149 168 206 305 396
239 254 375
197 249 306
199 288 315
143 212 216
114 340 379
195 222 286
3 47 99 172 190 240 242 248 285 329
71 335 369
70 211 285
149 225 271
52 188 255
66 118 384
269 299 375
54 79 179 192 197 204 272 322 352 377
29 38 305
141 195 309
182 261 300
124 324 397
120 225 280
82 124 164

88 112 120 132 137 210 289 341 356 358
5 276 331
72 118 381
55 313 341
32 202 360
259 337 356
88 190 216
5 31 35 104 187 218 224 244 284 291
35 192 399
78 214 219
103 196 346
39 168 394
95 154 338
4 240 282
21 122 148 155 195 233 319 330 344 362
301 321 341
358 372 389
54 297 317
229 296 381
278 359 362
11 77 338
252 57 108 123 189 252 279 317 385
31 235 352
79 161 259
101 138 164
84 278 302
44 306 373
60 143 301
6 45 92 105 142 198 209 241 302 388
104 288 392
156 369 374
109 112 222
180 325 379
171 214 235
106 348 352
119 166 234 250 262 283 363 365 387 394
10 123 398
58 260 298
46 322 344
67 97 316
113 219 323
212 224 251
30 37 145 152 156 182 213 260 313 381
153 268 374
83 152 225
65 245 397
0 222 368
20 45 213
315 340 387
86 115 136 153 193 211 276 320 378 381
54 182 291
35 230 247
269 291 337
241 252 341
161 209 239
71 81 155
0 38 43 70 135 141 242 283 366 386
12 91 208
67 127 344
11 87 325
141 172 328
58 72 250
36 203 289
27 65 76 186 222 255 260 266 280 347
196 223 234
28 207 261
81 178 347

109 145 372
68 91 271
9 112 250
40 49 86 106 124 140 151 178 207 244
2 361 373
174 235 271
195 213 392
133 144 176
48 358 375
61 181 369
23 44 80 114 262 264 277 298 359 369
14 280 285
29 65 191
36 118 280
31 285 301
62 72 78
113 118 246
10 39 201 212 275 287 329 332 382 388
165 275 397
231 295 386
58 185 292
80 233 312
50 196 261
32 136 208
89 170 172 188 261 265 301 305 313 387
185 214 252
21 314 396
216 284 359
4 46 194
252 282 349
157 226 260
0 97 107 113 177 204 224 269 362 370
82 250 395
108 132 248
189 211 254
166 254 263
18 79 284
140 165 347
3 123 160 202 236 278 316 344 371 392
155 292 366
98 145 233
15 51 289
24 247 346
47 90 276
10 292 384
43 111 131 161 218 250 282 318 320 348
48 60 338
12 194 308
34 335 377
251 288 306
24 101 207
110 115 228
1 52 67 104 135 138 309 314 326 373
24 68 284
175 242 301
94 262 339
162 292 386
17 138 292
65 144 211
636 38 79 93 109 120 235 288 330
11 27 70
45 140 253
342 368 378
238 261 272
39 286 339
215 283 396
78 81 153 176 240 252 321 324 351 366

30 88 148
44 166 300
56 121 124
130 245 387
27 273 295
161 233 336
35 158 190 232 268 300 343 349 389 394
89 98 344
8 125 155
83 123 312
94 112 326
163 253 385
141 176 235
7 22 51 142 179 230 238 279 325 335
0 117 359
302 364 375
44 105 201
18 102 267
6 81 249
183 313 393
57 87 183 194 200 214 239 347 384 386
140 171 308
189 244 392
26 348 360
147 193 315
198 222 376
130 270 346
41 91 119 122 144 163 306 338 355 377
63 133 202
15 20 294
50 205 256
11 23 197
75 227 307
19 207 243
34 65 71 130 175 256 273 289 331 337
183 296 315
202 284 292
115 331 366
49 53 195
11 104 328
72 94 101
63 92 102 152 192 248 281 341 353 383
10 220 257
181 268 288
25 238 252
313 366 369
293 298 336
255 284 389
18 26 90 185 226 254 322 379 391 396
3 122 204
24 128 349
16 24 45
51 160 234
157 176 224
108 312 335
17 62 68 112 129 145 154 303 340 352
11 269 320
34 49 216
49 142 281
91 279 384
23 54 301
62 205 244
126 134 150 168 205 219 271 345 368 374
90 256 385
62 85 283
98 160 170
127 330 367

55 150 247
51 95 366
30 66 116 164 171 173 191 203 233 364
94 139 255
281 305 346
250 267 357
12 34 361
61 97 242
31 119 182
5 40 128 208 296 334 350 356 372 397
105 246 379
40 293 326
90 218 237
249 327 383
175 383 397
121 170 206
50 98 132 174 198 229 290 304 328 339
54 366 395
112 144 199
35 74 253
60 125 211
200 299 325
54 86 278
25 28 61 88 127 249 253 284 317 319
66 311 337
352 359 384
21 128 384
48 101 270
96 105 217
174 201 308
20 59 99 101 143 196 241 291 307 323
16 143 357
117 223 274
9 29 183
173 224 350
76 151 271
4 12 19 60 105 155 180 182 193 399
73 171 338
113 237 266
43 274 375
1 29 336
255 316 330
21 31 82 197 223 251 286 308 315 398
158 250 345
198 262 299
13 133 154
15 262 371
153 194 270
2 14 74 121 136 162 216 270 272 311
25 312 323
86 131 180
52 212 220
105 208 362
51 243 354
15 29 48 53 64 94 210 257 263 385
41 210 238
102 244 318
80 314 327
115 293 356
164 190 229
32 54 125 148 159 169 217 259 292 312
196 350 398
5 59 71
78 188 396
13 68 375
84 180 216
42 56 110 245 333 342 346 357 365 367

192 286 360
75 146 221
71 176 228
291 335 339
220 267 392
9 13 47 72 206 221 293 302 327 380
80 138 149
91 97 303
135 159 398
63 274 322
88 296 326
75 77 96 118 141 165 215 234 295 390
48 304 383
93 258 381
14 217 305
170 210 364
86 288 357
16 46 69 84 137 139 149 166 258 276
9 14 212
8 32 77
82 95 214
27 43 171
126 204 309
11 45 58 85 167 231 285 297 354 360
37 170 232
129 207 330
22 148 202
191 218 289
26 64 334
8 76 100 108 184 220 237 247 361 395
60 100 209
1 145 243
10 613 23
62 119 298
233 297 398
24 37 73 95 140 147 209 228 243 310
61 75 321
308 355 365
173 187 193
158 240 309
279 368 395
33 115 157 187 199 255 267 299 363 376
50 147 331
120 175 388
63 100 307
236 307 320
156 172 324
55 10 3 133 156 227 246 274 294 336 393
2 239 342
6 12 96
2 181 393
266 329 380
85 275 364
22 83 117 143 181 189 195 280 375 378
81 254 370
169 204 235
62 131 264
47 128 149
19 181 203
26 40 127 146 225 228 230 233 299 358
43 57 355
321 383 386
169 332 348
215 259 385
13 179 228
5 86 152 154 253 262 307 337 348 388
200 327 353

88 104 219
86 175 299
121 323 391
143 264 303
29 44 77 79 178 246 297 318 331 387
1 23 99
209 224 299
117 139 340
6 184 239
193 221 365
133 174 232 252 265 273 275 306 363 384
55 201 387
39 117 389
28 92 111
54 71 138
65 195 291
33 135 185 191 220 263 293 301 333 378
36 336 397
157 278 340
37 66 300
106 187 260
59 360 380
8 53 104 164 205 226 236 274 303 376
42 51 106
139 283 345
69 280 343
163 353 374
158 182 258
15 75 106 182 196 209 286 358 383 394
116 325 393
37 273 324
317 365 399
100 185 392
22 344 361
28 101 162 165 200 259 354 357 372 382
137 213 332
72 203 282
108 207 389
43 102 289
209 327 391
3 14 21 84 142 144 153 158 167 264
46 185 234
260 265 343
61 198 373
15 67 192
33 80 321
72 131 177 192 225 238 243 251 298 371
68 243 347
150 210 294
74 85 352
83 256 294
83 109 133
2 42 151 184 214 300 328 366 375 380
92 205 215
4 167 328
75 140 155
56 141 178
12 187 262
19 126 156 159 188 199 202 326 346 362
90 335 341
111 136 240
35 123 358
32 223 281
10 3 142 169
0 17 146 175 255 261 268 276 308 385
107 371 388
64 126 161

73 113 230
2 287 318
5 165 329
70 88 113 163 186 213 217 309 364 397
38 269 399
349 353 356
132 189 347
7 41 251
99 322 381
7 9 56 74 87 168 176 256 291 330
111 150 322
28 198 370
284 321 353
70 215 218
125 341 396
18 121 129 161 180 285 373 381 386 393
18 273 333
206 285 369
7 258 275
34 147 238
42 244 313
10 49 78 103 118 145 224 239 312 339
114 131 184
102 179 361
154 182 265
49 283 320
140 202 272
45 47 61 187 195 229 257 288 390 396
22 77 164
33 70 302
33 100 345
37 265 302
53 119 308
12 99 115 138 234 270 281 289 296 379
74 240 297
60 141 233
8 19 177
21 93 245
20 78 388
39 98 140 197 211 222 248 269 327 349
154 229 279
277 372 379
148 221 334
14 28 263
107 169 350
92 110 116 249 260 315 329 344 360 369
56 153 390
30 200 385
120 199 273
110 124 160
150 314 399
52 54 89 105 114 207 280 287 355 398
162 263 362
67 336 374
126 357 398
38 266 332
187 225 231
65 82 111 139 169 212 237 290 317 323
32 39 172
116 143 279
142 349 390
26 31 111
0 87 248
37 69 194 201 292 295 316 319 342 370
124 143 203
163 171 249
56 165 257

10 115 208
70 274 349
20 31 48 80 125 150 157 190 203 250
52 121 227
23 127 153
21 151 310
9 107 394
57 346 395
64 122 141 166 189 241 247 266 305 356
163 334 351
17 242 259
30 135 338
69 162 168
25 67 186
55 67 95 100 170 242 244 279 332 347
76 169 252
69 255 338
295 344 355
123 210 240
114 148 204
90 137 173 179 206 219 227 245 282 284
6 236 391
125 137 350
36 41 78
29 166 308
66 193 254
38 41 58 108 130 136 147 183 254 267
245 251 330
166 320 358
122 152 200
1 136 274
152 232 259
36 51 66 71 96 102 112 221 277 338
13 97 193
107 122 329
242 268 297
15 184 290
25 363 379
1 11 16 34 73 97 120 223 334 392
93 136 365
110 194 399
14 90 181
60 148 260
29 310 378
35 85 134 149 155 198 208 210 311 336
272 282 373
99 158 246
157 287 378
40 71 122
27 49 323
25 57 62 81 83 128 218 278 304 322
10 3 148 183
152 304 387
129 272 277
4 366 387
128 241 357
6 117 124 148 193 215 310 314 352 361
316 356 368
184 266 293
225 59
52 342 388
112 279 324
43 46 94 107 109 181 272 313 321 368
217 258 318
7 191 309
40 55 282
46 132 237

15 126 272
76 93 132 160 172 283 335 343 350 374
19 241 377
172 268 352
65 87 146
89 183 197
82 177 287
32 60 171 231 240 340 345 353 367 377
101 182 187
132 215 296
178 281 354
129 188 236
96 264 307
13 50 63 123 204 271 294 320 359 399
33 104 270
38 89 382
89 206 319
130 146 355
256 322 367
23 30 74 91 95 235 258 302 365 389
109 177 226
108 162 180
16 204 248
149 331 378
127 252 326
59 68 119 216 289 297 364 388 391 395
291 363 367
79 130 390
76 203 382
136 335 352
116 135 145
24 97 131 138 203 258 319 325 341 351
26 88 340
31 155 287
17 107 305
174 241 277
122 147 268
4 87 114 188 211 260 278 293 300 307
47 59 160
190 231 276
232 243 331
159 369 382
35 125 276
27 50 60 101 157 230 253 311 324 327
44 172 344
68 93 138
0 85 293
40 95 346
125 152 175
11 148 244
32 123 154
142 299 377
24 183 268
179 198 384
93 188 361
56 161 237
9 270 385
40 43 202 204 209 214 222 342 351 379
37 267 354
178 306 382
38 223 370
71 332 343
50 137 372
12 131 157
108 224 382
112 304 365
57 92 99

118 195 263
44 239 265
33 40 315
86 186 191
31 38 91 167 181 241 259 336 347 392
189 221 373
64 74 327
98 230 380
165 282 327
49 249 363
78 138 367
91 173 288
40 144 359
7 129 378
194 211 257
235 250 316
7 167 225
3 52 162
11 20 26 89 136 176 187 217 247 368
41 185 370
102 331 345
155 187 252
58 90 273
115 185 221
236 242 384
119 135 254
172 314 388
213 292 354
81 106 339
100 137 197
62 262 301
39 112 396
17 10 3 122 216 243 267 295 318 372 374
123 280 341
247 277 312
238 292 314
57 320 393
17 316 347
116 286 351
74 259 325
164 204 366
322 335 362
167 344 372
264 294 345
140 320 361
55 259 266
9 15 96 99 161 175 186 227 229 357
281 295 392
84 365 386
73 79 234
21 99 340
120 168 309
75 92 300
61 95 172
35 102 348
141 225 334
134 215 241
1 152 236
209 230 369
168 299 392
23 59 128 207 234 251 263 284 340 344
12 318 364
77 288 372
24 299 329
210 310 323
284 289 381
25 126 359

9 79 397
138 145 394
30 101 232
67 160 266
19 130 332
287 348 397
105 126 135 140 166 174 195 256 329 352
69 131 356
18 137 383
5 302 313
9 209 339
26 47 392
189 341 390
11 29 41
128 281 303
216 306 398
73 125 222
45 55 295
30 165 362
10 18 76 111 113 120 152 191 194 376
3 28 100
105 109 151
199 350 395
23 108 118
59 158 166
122 178 396
240 269 293
13 88 313
27 305 315
5 210 242
86 237 346
84 96 271
36 90 108 199 239 268 287 331 359 377
43 133 371
24 98 397
88 129 150
41 303 373
102 151 261
184 258 352
60 72 120
36 114 209
62 122 191
147 206 350
14 94 387
15 252 258
7 145 228 244 249 254 257 277 320 384
58 139 210
13 159 290
18 144 276
62 67 174
77 127 182
114 251 297
16 244 375
181 229 356
78 297 347
126 170 385
3 317 381
78 198 267
52 56 106 117 173 210 236 266 272 396
1 76 263
30 80 317
192 331 382
43 263 277
46 105 383
134 153 285
202 333 341
258 343 386

109 309 340
31 37 76
79 184 206
97 125 339
42 47 54 84 107 154 164 219 250 378
17 99 343
238 275 390
2 84 201
208 256 348
142 245 308
63 94 193
42 116 207
174 367 390
255 300 327
15 139 179
5 39 289
23 218 337
28 82 94 178 206 240 338 361 375 394
2 39 56
171 200 237
112 181 294
65 149 215
130 163 224
164 241 295
161 214 307
51 168 274
12 192 342
47 308 395
103 132 366
1 123 142
30 62 86 92 139 159 172 221 356 386
38 298 361
104 191 388
180 205 260
173 211 385
42 61 196
8 133 364
69 153 323
87 261 285
53 271 371
176 230 318
98 134 373
91 222 394
69 104 109 163 170 183 275 325 358 399
42 166 213
204 273 358
147 217 333
97 232 247
259 345 398
30 161 262
107 190 379
253 331 394
33 166 287
23 200 231
273 343 396
43 229 347
49 58 65 93 110 123 248 306 345 362
173 180 337
93 168 302
160 321 338
35 44 119
143 188 399
219 228 305
0 199 321
70 312 330
296 319 373
187 278 289

247 286 386
25 44 194
224 72 79 102 153 190 215 332 355
50 55 89
317 351 357
27 279 291
230 274 306
72 145 374
48 110 140
216 351 368
17 52 90
136 165 180
83 203 245
77 108 238
42 363 382
4 27 29 118 168 184 197 303 341 365
63 171 179
21 46 254
113 124 307
53 198 275
109 136 264
248 304 318
58 175 326
8 149 267
16 49 80
84 104 117
149 159 256
231 244 352
12 25 100 132 269 292 302 348 371 390
129 194 350
33 156 162
257 280 328
1 128 311
107 267 360
167 290 326
177 223 290
32 219 277
26 34 310
64 115 158
150 174 393
4 89 251
146 208 224 237 279 288 305 381 383 391
160 219 285
233 329 333
4 227 361
39 66 296
218 355 362
52 87 337
96 169 279
46 207 360
38 51 157
65 228 302
37 291 308
13 19 49
66 73 180 218 226 238 326 328 389 398
158 175 188
154 272 316
68 195 237
37 60 81
156 334 349
100 266 312
20 155 393
105 127 370
48 156 189
243 282 399
282 288 342
156 178 377

22 64 68 133 149 171 299 304 314 380
196 377 385
186 246 360
28 203 269
111 354 368
34 121 202
3 135 170
131 221 233
98 151 358
4 97 146
89 208 238
16 117 261
68 227 327
3 83 98 182 235 274 335 354 367 385
75 223 388
56 255 303
83 213 298
15 265 397
69 82 220
76 200 366
18 59 77
139 234 353
185 227 276
20 68 148
69 90 143
11 121 163
141 148 162 198 212 246 271 282 301 369
120 229 300
253 335 387
91 190 226
7 283 356
104 243 250
19 33 379
6 50 111
2 260 275
28 328 364
182 248 336
131 242 306
213 221 345
14 61 63 119 130 137 155 231 265 316
14 103 321
45 73 169
103 206 342
80 146 229
64 344 375
14 214 358
150 212 338
21 36 163
10 178 247
201 240 380
170 246 329
128 144 196
0 88 160 165 169 273 281 310 330 387
257 339 374
54 106 330
123 176 386
191 281 322
141 239 365
183 355 389
82 320 329
159 171 251
25 220 369
133 186 311
146 192 326
120 185 217
5 41 48 143 151 255 312 333 349 393
170 239 394

29 55 225
222 270 301
101 315 325
132 197 353
22 86 369
43 337 392
113 256 272
110 280 376
270 298 352
71 284 324
58 200 371
39 121 144 185 192 205 308 324 334 343
154 199 209
10 74 117
70 371 378
212 235 278
287 376 391
194 231 284
63 226 252
71 85 391
374 383 389
124 196 217
46 219 317
182 220 375
8 35 55 142 189 196 213 233 321 363
52 149 184
22 177 324
89 271 336
31 159 377
6 268 319
13 54 205
301 349 363
66 121 357
56 193 249
75 246 283
59 113 189
75 137 376
112 127 134 177 201 220 245 315 322 337
140 285 379
124 254 349
19 45 53 77 115 129 200 232 294 313
239 323 351
53 247 302
16 33 125 147 158 286 290 298 366 397
41 67 169
40 75 354
32 51 75 78 242 276 280 296 309 346
93 294 333
182 211 361
46 81 150 156 223 225 264 270 283 395
177 360 390
6 160 298
34 37 67 70 116 124 262 317 353 382
95 290 311
181 235 310
121 71 80 193 252 285 291 370 375
118 147 399
175 194 267
6 13 57 85 144 261 339 348 350 373
76 319 340
50 170 218
8 44 84 179 186 207 254 308 323 371
64 83 350
263 369 396
64 72 182 218 242 249 255 323 368 387
171 332 356
81 195 325

111 115 143 230 263 286 319 326 392 395
127 162 313
132 159 323
6 18 114 173 248 257 305 321 354 365
36 152 183
65 100 342
12 61 82 106 118 200 217 252 343 360
100 130 255
23 250 275
11 53 10 3 127 202 238 259 293 329 373
203 215 335
188 291 351
2 10 13 92 146 219 298 301 324 331
153 201 314
60 129 362
39 122 164 167 239 281 292 304 320 335
65 250 321
222 256 319
34 62 123 151 156 209 247 291 296 325
115 278 388
10 382 29
21 40 101 126 141 171 177 262 276 316
80 158 354
89 166 284
45 49 54 66 88 158 161 211 275 379
102 235 269
31 193 380
20 51 139 195 228 264 268 272 372 399
24 32 188
73 111 387
15 73 83 85 100 224 270 295 356 396
26 184 372
17 120 177
57 104 153 157 168 172 196 297 336 361
190 210 344
148 305 390
75 113 159 232 236 260 289 351 355 374
6 281 316
207 273 338
4 91 131 135 189 205 231 342 362 383
21 70 298
94 241 370
16 23 29 67 110 198 278 313 358 391
82 260 387
44 143 340
1 26 30 93 98 130 154 180 266 353
205 233 381
2 399
121 215 222 339 346 370 377 380 384 398
106 176 322
129 162 175 185 203 332 338 349 367 376
18 325 395
41 80 102 148 160 214 216 237 240 287
101 114 216
28 31 47 97 124 132 134 142 176 183
195 274 297
0 7 36 65 77 81 166 210 226 333
202 249 263
55 90 140 152 193 251 290 350 364 386
0 34 105
37 87 128 174 191 225 288 294 341 394
53 207 310
5 22 24 43 78 194 246 273 345 389
47 136 212
3 19 86 108 117 187 197 212 234 265
2 132 228
69 120 133 147 213 241 256 285 328 340

139 151 218
60 107 138 282 312 317 322 347 366 390
87 94 349
63 71 95 116 169 181 199 227 253 303
148 253 380
68 89 94 155 165 235 245 277 306 309
81 288 365
48 59 74 170 204 223 300 310 357 381
38 54 124
14 56 76 112 229 261 284 307 327 363
22 28 286
35 137 145 150 184 279 302 318 337 344
155 275 346
32 44 50 99 192 233 267 378 385 397
197 214 318
9 17 38 119 178 201 280 299 334 360
61 330 358
25 33 46 136 221 244 250 314 382 393
60 179 296
27 52 58 96 109 179 190 243 274 369
50 104 307
77 105 125 163 206 269 283 311 315 359
133 334 389
94 208 229 250 254 258 264 271 330 388
224 240 302
15 42 58 142 149 181 232 327 352 364
254 268 279
13 43 45 65 80 118 220 308 349 382
57 73 357
79 101 115 123 125 127 183 314 338 340
164 291 383
31 70 85 95 139 201 207 328 363 381
257 276 304
21 116 132 168 216 224 241 294 367 387
99 181 262
38 47 74 151 211 213 262 323 362 374
10 109 193
72 144 147 186 188 194 197 312 321 375
51 341 384
100 128 136 157 169 195 343 353 369 391
145 172 272
73 90 167 191 253 267 302 352 355 393
92 10 3 277
16 39 53 108 114 291 346 356 378 390
74 141 273
37 61 109 176 189 202 246 251 289 304
223 336 364
12 32 222 271 287 293 311 313 365 395
17 31 96
50 69 78 122 154 190 284 322 383 398
85 107 355
8 29 63 91 124 172 219 230 269 330
27 72 265
19 131 206 249 252 261 274 296 345 388
12 116 300
3 7 64 82 93 146 199 300 339 396
48 119 236
23 26 35 141 163 223 248 292 307 333
45 154 283
98 149 153 161 165 188 192 217 337 389
138 160 328
0 49 62 137 152 170 234 317 324 373
226 243 312
1 96 113 162 208 244 283 303 316 361
29 143 367
81 97 112 174 212 260 286 299 309 399
35 63 324

5 28 42 99 120 126 129 148 179 295
122 129 234
4 52 66 159 237 310 325 347 370 397
241 331 338
46 79 121 133 135 233 278 298 372 394
111 204 211
9 20 92 160 193 235 279 336 358 379
66 208 378
18 87 89 110 145 209 258 266 297 392
232 280 359
10 40 48 54 56 70 238 273 277 318
88 264 391
51 83 88 111 166 173 196 259 334 359
173 353 370
33 76 102 119 138 227 239 288 344 385
295 309 368
34 84 140 215 231 268 280 301 357 368
14 135 175
1130 106 143 218 245 256 281 290 371
126 187 305
22 75 105 107 150 214 226 275 285 331
0 20 180
2 6 177 187 221 242 320 326 351 377
157 303 395
24 117 155 175 204 240 270 315 350 354
110 199 290
14 41 55 59 180 243 276 342 366 376
300 379 398
17 25 182 198 200 203 247 263 306 380
43 82 293
57 68 10 3 158 164 178 185 228 282 341
183 245 274
67 171 205 210 220 255 265 319 335 348
70 248 308
27 36 44 86 104 130 225 272 329 384
126 213 324
60 71 74 134 156 184 305 319 360 386
34 255 386
19 23 40 46 65 113 143 287 304 366
130 219 292
22 67 82 134 152 207 295 321 362 367
176 243 294
15 54 68 78 115 244 251 274 325 337
138 208 260
147 185 195 212 230 232 239 258 283 305
16 112 224
3 30 118 181 183 211 226 273 284 370
56 216 375
7 28 98 112 156 171 193 218 236 241
169 180 334
57 117 154 174 186 233 264 276 332 368
117 165 268
0 6 42 75 95 145 282 315 334 345
271 306 321
2599 102 110 137 159 191 205330384
64 311 393
35 59 80 100 161 176 236 306 313 383
21 79 95
64 66 127 130 167 187 214 349 369 395
107 128 258
4 38 92 104 128 216 308 327 333 338
8 201 221
1 131 166 188 198 248 323 343 378 393
167 249 359
13 26 238 242 265 267 281 288 300 364
252 329 368
45 62 69 175 177 271 329 335 372 375

205 286 355
119 196 215 228 247 294 303 347 353 379
161 288 360
24 63 81 120 146 200 266 314 342 390
76 87 233
8 10 47 60 73 87 153 272 280 290
45 149 262
85 96 136 151 204 268 292 388 392 397
245 317 391
12 31 56 77 84 93 148 213 356 376
121 198 344
11 33 142 173 225 237 246 254 348 380
98 162 276
41 53 72 105 158 168 262 270 322 386
25 157 215
49 79 90 94 172 220 299 316 346 351
32 226 374
16 86 89 121 182 252 257 269 289 340
49 186 296
9 18 55 97 122 157 179 202 210 231
83 92 179
39 126 190 209 234 245 257 279 311 331
5 101 174
20 37 50 107 197 293 296 357 361 387
68 135 234
51 164 201 256 298 310 326 355 358 396
62 90 110
58 76 124 150 192 199 208 291 309 312
12 72 151
44 91 111 123 129 223 243 253 382 391
19 239 280
2 138 170 224 277 286 354 363 371 374
104 144 381
5 17 34 109 125 132 162 184 373 398
166 228 339
101 140 144 149 189 203 235 249 297 328
48 230 388
14 106 114 194 255 259 302 317 332 377
13 270 367
36 43 88 10 3 139 155 285 307 352 385
196 240 389
71 108 133 217 219 229 260 320 350 365
59 206 264
27 163 221 227 240 278 301 318 339 360
29 314 350
21 32 48 83 135 160 178 180 275 324
122 158 337
116 141 206 222 250 263 336 341 381 389
292 301 372
26 29 52 61 70 169 261 376 394 399
36 145 178
8 80 134 151 199 248 286 293 344 347
277 326 352
13 35 71 124 191 200 297 340 351 356
212 341 371
21 43 74 76 137 140 188 257 359 391
116 335 346
28 32 34 41 89 138 141 272 298 348
52 265 320
6 30 44 72 217 230 244 287 336 363
96 220 282
33 53 160 163 174 261 319 323 354 383
39 184 322
95 102 109 118 122 187 238 271 342 386
78 304 332
23 45 157 178 208 219 289 315 385 393
125 244 378

50 92 165 212 254 270 285 318 325 366
41 200 398
3 65 119 192 232 295 301 320 328 330
24 88 365
161 164 172 177 179 222 273 300 312 367
3 61 348
11 47 57 75 114 135 156 181 224 335
123 171 261
46 55 62 66 182 190 241 299 333 359
57 251 383
27 93 117 126 267 269 275 284 313 380
9 140 303
22 70 90 106 155 158 162 170 288 388
84 189 331
31 42 108 115 131 152 171 202 358 368
14 190 283
18 58 86 94 169 198 215 223 239 324
154 185 382
1 7 68 121 175 184 189 296 310 382
172 203 227
48 107 193 196 205 243 280 292 337 396
86 385 399
14 16 54 64 96 128 233 253 256 389
20 74 373
52 83 99 113 139 146 154 327 346 360
67 164 318
19 29 112 173 194 311 339 355 372 392
30 133 343
4 36 153 206 255 306 334 353 371 395
22 136 146
56 63 104 132 149 186 240 263 349 379
47 313 356
0 91 110 197 203 305 314 331 374 397
71 173 363
15 38 84 125 133 204 245 303 307 321
51 108 327
130 144 148 220 258 279 294 304 364 398
80 210 253
25 78 101 150 167 201 237 362 373 377
27 10 3 209
73 127 143 145 165 176 231 242 262 308
105 231 394
17 39 88 123 159 195 225 282 361 381
197 285 309
10 82 98 209 213 226 259 264 278 341
33 150 297
5 79 100 168 227 260 268 283 326 370
42 236 257
49 69 97 105 228 266 274 344 378 387
142 266 289
40 67 77 85 147 180 302 357 369 384
54 91 134
103 116 120 136 166 214 236 338 345 399
204 238 299
2 12 20 81 111 185 207 329 350 394
7 119 366
24 142 211 221 234 249 290 309 316 322
114 127 141
51 60 183 210 216 246 281 291 332 352
55 118 353
9 129 144 213 218 247 251 265 365 390
37 328 345
61 99 163 218 232 277 302 324 345 350
63 77 217
18 100 149 174 200 230 272 317 346 375
109 155 242
37 45 79 131 237 276 303 333 364 389

232 272 293
58 113 119 128 187 235 264 314 325 381
191 248 259
6 22 32 87 118 127 216 251 328 379
28 113 168
28 44 75 152 238 250 266 310 349 377
139 279 312
42 77 137 209 261 263 267 270 320 343
11 93 316
9 61 64 154 170 226 228 296 318 362
1 192 214
16 87 102 105 111 116 157 162 265 396
156 269 357
15 23 109 168 225 240 306 319 347 376
147 223 358
65 134 179 193 277 299 307 339 356 387
15 131 392
7 25 178 188 262 273 294 327 340 372
85 99 225
53 107 139 142 180 186 199 278 351 382
26 237 330
43 51 114 138 172 206 217 236 290 357
18 66 153
13 46 59 145 169 177 255 354 358 378
102 199 246
76 106 147 156 190 198 219 295 297 353
69 278 397
39 73 81 93 115 141 173 181 323 360
46 364 377
8 56 122 130 135 212 244 253 312 370
106 163 376
78 151 160 191 197 210 229 326 329 391
315 336 384
69 129 136 164 215 224 248 252 287 315
137 187 202
62 95 97 108 167 211 289 367 380 383
35 58 281
26 72 124 189 201 271 283 286 384 393
307 347 374
1 49 74 101 159 194 222 229 242 371
97 115 295
50 146 161 166 184 203 207 260 368 388
152 287 333
0 4 8
0 1
1 2
2 3
3 4
4 5
5 6
6 7
7 8
8 9
9 10
10 11
11 12
12 13
13 14
14 15
15 16
16 17
17 18
18 19
19 20
20 21
21 22
22 23
23 24
24 25
25 26
26 27
27 28
28 29
29 30
30 31
31 32
32 33
33 34
34 35
35 36
36 37
37 38
38 39
39 40
40 41
41 42
42 43
43 44
44 45
45 46
46 47
47 48
48 49
49 50
50 51
51 52
52 53
53 54
54 55
55 56
56 57
57 58
58 59
59 60
60 61
61 62
62 63
63 64
64 65
65 66
66 67
67 68
68 69
69 70
70 71
71 72
72 73
73 74
74 75
75 76
76 77
77 78
78 79
79 80
80 81
81 82
82 83
83 84
84 85
85 86
86 87
87 88
88 89
89 90

| | |
|---|---|
| 90 | 91 |
| 91 | 92 |
| 92 | 93 |
| 93 | 94 |
| 94 | 95 |
| 95 | 96 |
| 96 | 97 |
| 97 | 98 |
| 98 | 99 |
| 99 | 100 |
| 100 | 101 |
| 101 | 102 |
| 102 | 103 |
| 103 | 104 |
| 104 | 105 |
| 105 | 106 |
| 106 | 107 |
| 107 | 108 |
| 108 | 109 |
| 109 | 110 |
| 110 | 111 |
| 111 | 112 |
| 112 | 113 |
| 113 | 114 |
| 114 | 115 |
| 115 | 116 |
| 116 | 117 |
| 117 | 118 |
| 118 | 119 |
| 119 | 120 |
| 120 | 121 |
| 121 | 122 |
| 122 | 123 |
| 123 | 124 |
| 124 | 125 |
| 125 | 126 |
| 126 | 127 |
| 127 | 128 |
| 128 | 129 |
| 129 | 130 |
| 130 | 131 |
| 131 | 132 |
| 132 | 133 |
| 133 | 134 |
| 134 | 135 |
| 135 | 136 |
| 136 | 137 |
| 137 | 138 |
| 138 | 139 |
| 139 | 140 |
| 140 | 141 |
| 141 | 142 |
| 142 | 143 |
| 143 | 144 |
| 144 | 145 |
| 145 | 146 |
| 146 | 147 |
| 147 | 148 |
| 148 | 149 |
| 149 | 150 |
| 150 | 151 |
| 151 | 152 |
| 152 | 153 |
| 153 | 154 |
| 154 | 155 |
| 155 | 156 |
| 156 | 157 |
| 157 | 158 |
| 158 | 159 |
| 159 | 160 |
| 160 | 161 |
| 161 | 162 |
| 162 | 163 |
| 163 | 164 |
| 164 | 165 |
| 165 | 166 |
| 166 | 167 |
| 167 | 168 |
| 168 | 169 |
| 169 | 170 |
| 170 | 171 |
| 171 | 172 |
| 172 | 173 |
| 173 | 174 |
| 174 | 175 |
| 175 | 176 |
| 176 | 177 |
| 177 | 178 |
| 178 | 179 |
| 179 | 180 |
| 180 | 181 |
| 181 | 182 |
| 182 | 183 |
| 183 | 184 |
| 184 | 185 |
| 185 | 186 |
| 186 | 187 |
| 187 | 188 |
| 188 | 189 |
| 189 | 190 |
| 190 | 191 |
| 191 | 192 |
| 192 | 193 |
| 193 | 194 |
| 194 | 195 |
| 195 | 196 |
| 196 | 197 |
| 197 | 198 |
| 198 | 199 |
| 199 | 200 |
| 200 | 201 |
| 201 | 202 |
| 202 | 203 |
| 203 | 204 |
| 204 | 205 |
| 205 | 206 |
| 206 | 207 |
| 207 | 208 |
| 208 | 209 |
| 209 | 210 |
| 210 | 211 |
| 211 | 212 |
| 212 | 213 |
| 213 | 214 |
| 214 | 215 |
| 215 | 216 |
| 216 | 217 |
| 217 | 218 |
| 218 | 219 |
| 219 | 220 |
| 220 | 221 |
| 221 | 222 |
| 222 | 223 |
| 223 | 224 |

| | |
|---|---|
| 224 225 | 291 292 |
| 225 226 | 292 293 |
| 226 227 | 293 294 |
| 227 228 | 294 295 |
| 228 229 | 295 296 |
| 229 230 | 296 297 |
| 230 231 | 297 298 |
| 231 232 | 298 299 |
| 232 233 | 299 300 |
| 233 234 | 300 301 |
| 234 235 | 301 302 |
| 235 236 | 302 303 |
| 236 237 | 303 304 |
| 237 238 | 304 305 |
| 238 239 | 305 306 |
| 239 240 | 306 307 |
| 240 241 | 307 308 |
| 241 242 | 308 309 |
| 242 243 | 309 310 |
| 243 244 | 310 311 |
| 244 245 | 311 312 |
| 245 246 | 312 313 |
| 246 247 | 313 314 |
| 247 248 | 314 315 |
| 248 249 | 315 316 |
| 249 250 | 316 317 |
| 250 251 | 317 318 |
| 251 252 | 318 319 |
| 252 253 | 319 320 |
| 253 254 | 320 321 |
| 254 255 | 321 322 |
| 255 256 | 322 323 |
| 256 257 | 323 324 |
| 257 258 | 324 325 |
| 258 259 | 325 326 |
| 259 260 | 326 327 |
| 260 261 | 327 328 |
| 261 262 | 328 329 |
| 262 263 | 329 330 |
| 263 264 | 330 331 |
| 264 265 | 331 332 |
| 265 266 | 332 333 |
| 266 267 | 333 334 |
| 267 268 | 334 335 |
| 268 269 | 335 336 |
| 269 270 | 336 337 |
| 270 271 | 337 338 |
| 271 272 | 338 339 |
| 272 273 | 339 340 |
| 273 274 | 340 341 |
| 274 275 | 341 342 |
| 275 276 | 342 343 |
| 276 277 | 343 344 |
| 277 278 | 344 345 |
| 278 279 | 345 346 |
| 279 280 | 346 347 |
| 280 281 | 347 348 |
| 281 282 | 348 349 |
| 282 283 | 349 350 |
| 283 284 | 350 351 |
| 284 285 | 351 352 |
| 285 286 | 352 353 |
| 286 287 | 353 354 |
| 287 288 | 354 355 |
| 288 289 | 355 356 |
| 289 290 | 356 357 |
| 290 291 | 357 358 |

| | |
|---|---|
|358| 359|
|359| 360|
|360| 361|
|361| 362|
|362| 363|
|363| 364|
|364| 365|
|365| 366|
|366| 367|
|367| 368|
|368| 369|
|369| 370|
|370| 371|
|371| 372|
|372| 373|
|373| 374|
|374| 375|
|375| 376|
|376| 377|
|377| 378|
|378| 379|
|379| 380|
|380| 381|
|381| 382|
|382| 383|
|383| 384|
|384| 385|
|385| 386|
|386| 387|
|387| 388|
|388| 389|
|389| 390|
|390| 391|
|391| 392|
|392| 393|
|393| 394|
|394| 395|
|395| 396|
|396| 397|
|397| 398|
|398| 399|

While the invention has been particularly shown and described with reference to a particular embodiment, it will be understood by those skilled in the art that various changes in form and details may be made therein without departing from the spirit and scope of the invention. For example, while the invention has been shown with the ordering of $s_i$ and $p_i$ within x defined, one of ordinary skill in the art will recognize that other ordering of the bits within x can occur since the codeword bits can be collected in any order as long as the columns of H are reordered accordingly. Additionally, while the above-description has been particularly shown and described with reference to binary codes (i.e., codes defined over the Galois Field GF(2)), one of ordinary skill in the art will recognize that an arbitrary GF may be utilized as well. Although the examples given above are shown in one format, other formats are possible which allow similar encoding and code modification procedure. For example, the rows of H may be permuted without affecting the value of the parity-check bits. In yet another example, the shortened positions may be distributed within $H_1$, resulting in an equivalent interlacing effect. The matrix H may also be used in any type of decoder that relies upon a parity-check matrix. It is intended that such changes come within the scope of the following claims.

The invention claimed is:

1. A method for operating a transmitter that generates parity-check bits $(p_0, \ldots, p_{m-1})$ based on a current symbol set $s=(s_0, \ldots, s_{k-L-1})$, the method comprising the steps of:
    receiving the current symbol set $s=(s_0, \ldots, s_{k-L-1})$, where L is a number of bits the current symbol set is shortened, $0<=L<=k-1$, and k is the length of the entire current symbol set when unshortened;
    using a matrix H to determine the parity-check bits, wherein H comprises a section $H_1$ and a section $H_2$, and wherein $H_1$ has a plurality of different column weights and comprises a plurality of sub-matrices where columns of at least one weight are substantially interlaced between the sub-matrices; and
    transmitting the parity-check bits along with the current symbol set.

2. The method of claim 1 wherein:

$$H_2 = [h \ H_2'] = \begin{bmatrix} h_0 & 1 & & & & & & & & \\ h_1 & 1 & 1 & & & & & & & \\ \vdots & & 1 & 1 & & & & 0 & & \\ \vdots & & & 1 & 1 & & & & & \\ \vdots & & & & 1 & 1 & & & & \\ \vdots & & & & & 1 & 1 & & & \\ \vdots & & 0 & & & & 1 & 1 & & \\ \vdots & & & & & & & 1 & 1 & \\ \vdots & & & & & & & & \ddots & \ddots \\ \vdots & & & & & & & & & 1 & 1 \\ \vdots & & & & & & & & & & 1 & 1 \\ h_{m-1} & & & & & & & & & & & 1 \end{bmatrix}.$$

3. The method of claim 1 wherein:

$$H_2 = \begin{bmatrix} 1 & & & & & & & & & \\ 1 & 1 & & & & & & & & \\ & 1 & 1 & & & & 0 & & & \\ & & 1 & 1 & & & & & & \\ & & & 1 & 1 & & & & & \\ & & & & 1 & 1 & & & & \\ & & & & & 1 & 1 & & & \\ & & 0 & & & & 1 & 1 & & \\ & & & & & & & 1 & \ddots & \\ & & & & & & & & \ddots & 1 \\ & & & & & & & & 1 & 1 \\ & & & & & & & & & 1 & 1 \end{bmatrix}.$$

4. The method of claim 1 wherein section $H_2$ is non-deterministic.

5. The method of claim 1 wherein the columns of the plurality of sub-matrices are interlaced based on a desired column weight distribution for the sub-matrices.

6. The method of claim 1 wherein the at least one column weight is uniformly interlaced among the plurality of sub-matrices when a desired column weight distribution of the at least one column weight is the same for each of the plurality of sub-matrices.

7. The method of claim 1 wherein at least one column weight is non-uniformly interlaced among the plurality of sub-matrices when a desired column weight distribution of the at least one column weight is different for the plurality of sub-matrices.

8. The method of claim 1 wherein within a sub-matrix, columns of different weights are interlaced such that the columns of different weights are spread predominantly uniformly over the sub-matrix.

9. The method of claim 1 wherein $H_1$ comprises sub-matrices $H_{1a}$, and $H_{1b}$, where $H_{1a}$ comprises a first L columns of $H_1$, and $H_{1b}$ comprises a remaining k–L columns of $H_1$.

10. The method of claim 9 wherein the step of using the matrix H to determine the parity-check bits comprises the step of using matrix H to determine the parity-check bits, when L=0.

11. The method of claim 9 further comprising the steps of:

pre-pending L zeros to the current symbol set;

determine the parity-check bits using the pre-pended current symbol set and matrix H; and removing the L zeros from the current symbol set before transmitting.

12. The method of claim 9 wherein the step of using the matrix H to determine the parity-check bits comprises the step of using sub-matrix $H_{1b}$ and section $H_2$ to determine the parity-check bits, when L>0.

13. The method of claim 9 further comprising the step of further subdividing sub-matrix $H_{1a}$ and/or $H_{1b}$ into a plurality of smaller submatrices with columns of a given weight interlaced over the smaller submatrices.

14. A method for operating a receiver that estimates a current symbol set $s=(s_0, \ldots, s_{k-L-1})$, the method comprising the steps of:

receiving a signal vector $y=(y_0 \ldots y_{n-L-1})$, $0 \leq L \leq k-1$; and using a matrix H to estimate the current symbol set $(s_0, \ldots, s_{k-L-1})$, wherein H comprises a section $H_1$ and a section $H_2$, and wherein $H_1$ has a plurality of different column weights and comprises a plurality of sub-matrices where columns of at least one weight are substantially interlaced between the sub-matrices;

wherein $$H_2 = [h \; H_2']$$

$$= \begin{bmatrix} h_0 & 1 & & & & & & & & \\ h_1 & 1 & 1 & & & & & & & \\ \vdots & & 1 & 1 & & & 0 & & & \\ \vdots & & & 1 & 1 & & & & & \\ \vdots & & & & 1 & 1 & & & & \\ \vdots & & & & & 1 & 1 & & & \\ \vdots & & & 0 & & & 1 & 1 & & \\ \vdots & & & & & & & 1 & 1 & \\ \vdots & & & & & & & & \ddots & \ddots \\ \vdots & & & & & & & & & 1 & 1 \\ h_{m-1} & & & & & & & & & & 1 \end{bmatrix}.$$

15. The method of claim 14 wherein:

$$H_2 = \begin{bmatrix} 1 & & & & & & & & \\ 1 & 1 & & & & & & & \\ & 1 & 1 & & & 0 & & & \\ & & 1 & 1 & & & & & \\ & & & 1 & 1 & & & & \\ & & & & 1 & 1 & & & \\ & & & & & 1 & 1 & & \\ & & 0 & & & & 1 & 1 & \\ & & & & & & & 1 & \ddots \\ & & & & & & & & \ddots & 1 \\ & & & & & & & & & 1 & 1 \\ & & & & & & & & & & 1 & 1 \end{bmatrix}.$$

16. An apparatus comprising:

storage means for storing a matrix H;

a microprocessor using a matrix H to determine parity-check bits, wherein H comprises a section $H_1$ and a section $H_2$, and wherein $H_1$ has a plurality of different column weights and comprises a plurality of sub-matrices where columns of at least one weight are substantially interlaced between the sub-matrices; and a transmitter for transmitting the parity-check bits along with the current symbol set;

wherein $$H_2 = [h \; H_2']$$

$$= \begin{bmatrix} h_0 & 1 & & & & & & & & \\ h_1 & 1 & 1 & & & & & & & \\ \vdots & & 1 & 1 & & & 0 & & & \\ \vdots & & & 1 & 1 & & & & & \\ \vdots & & & & 1 & 1 & & & & \\ \vdots & & & & & 1 & 1 & & & \\ \vdots & & & 0 & & & 1 & 1 & & \\ \vdots & & & & & & & 1 & 1 & \\ \vdots & & & & & & & & \ddots & \ddots \\ \vdots & & & & & & & & & 1 & 1 \\ \vdots & & & & & & & & & & 1 & 1 \\ h_{m-1} & & & & & & & & & & & 1 \end{bmatrix}.$$

17. The apparatus of claim 16 wherein $$H_2 = \begin{bmatrix} 1 & & & & & & & & \\ 1 & 1 & & & & & & & \\ & 1 & 1 & & & 0 & & & \\ & & 1 & 1 & & & & & \\ & & & 1 & 1 & & & & \\ & & & & 1 & 1 & & & \\ & & & & & 1 & 1 & & \\ & & 0 & & & & 1 & 1 & \\ & & & & & & & 1 & \ddots \\ & & & & & & & & \ddots & 1 \\ & & & & & & & & & 1 & 1 \\ & & & & & & & & & & 1 & 1 \end{bmatrix}.$$

* * * * *